US012806731B2

(12) United States Patent
Cho et al.

(10) Patent No.: US 12,806,731 B2
(45) Date of Patent: Nov. 24, 2026

(54) SUBSTRATE TRANSFERRING SYSTEM

(71) Applicant: KCTECH CO., LTD., Gyeonggi-do (KR)

(72) Inventors: Moon Gi Cho, Gyeonggi-do (KR); Hee Sung Chae, Gyeonggi-do (KR); Seung Eun Lee, Seoul (KR); Geun Sik Yun, Gyeonggi-do (KR)

(73) Assignee: KCTECH CO., LTD., Anseong-si (KR)

( * ) Notice: Subject to any disclaimer, the term of this patent is extended or adjusted under 35 U.S.C. 154(b) by 949 days.

(21) Appl. No.: 17/583,624

(22) Filed: Jan. 25, 2022

(65) Prior Publication Data

US 2022/0274264 A1 Sep. 1, 2022

(30) Foreign Application Priority Data

Feb. 26, 2021 (KR) ........................ 10-2021-0026383

(51) Int. Cl.

| | |
|---|---|
| ***B24B 27/00*** | (2006.01) |
| ***B24B 7/00*** | (2006.01) |
| ***H10P 72/30*** | (2026.01) |
| ***H10P 72/76*** | (2026.01) |
| *B25J 11/00* | (2006.01) |
| *B65G 49/06* | (2006.01) |

(52) U.S. Cl.

CPC ............ *B24B 27/0069* (2013.01); *B24B 7/00* (2013.01); *H10P 72/3304* (2026.01); *H10P 72/7621* (2026.01); *B25J 11/0095* (2013.01); *B65G 49/061* (2013.01)

(58) Field of Classification Search

CPC . B25J 15/0014; B25J 11/0095; B65G 49/061; B65G 49/063; B65G 2201/022; H01L 21/67745; H01L 21/68774; H01L 21/67173; H01L 21/67742; H01L 21/68771; B24B 7/0069; B24B 7/00; B24B 27/0069; B24B 37/345; H10P 72/3304; H10P 72/3218; H10P 72/7621

USPC .......................................................... 451/332

See application file for complete search history.

(56) References Cited

U.S. PATENT DOCUMENTS 3,399,498 A * 9/1968 Lampani ................... B24B 9/06 451/247
6,629,883 B2 * 10/2003 Katsuoka .......... H01L 21/67745 451/41
10,857,646 B2 * 12/2020 Xu .......................... B24B 37/30
(Continued)

FOREIGN PATENT DOCUMENTS

CN 208589417 U 3/2019
JP 2002198329 A 7/2002

*Primary Examiner* — Brian D Keller
*Assistant Examiner* — Marcel T Dion
(74) *Attorney, Agent, or Firm* — DICKINSON WRIGHT PLLC

(57) ABSTRACT

A substrate transferring system may include a first transfer unit to transfer a substrate along a circular first orbit while rotating on a first axis perpendicular to a ground, and a second transfer unit to transfer a substrate along a circular second orbit while rotating on a second axis perpendicular to the ground, wherein the first orbit and the second orbit may overlap with each other at a first point, and at the first point, a substrate may be transferred from the first transfer unit to the second transfer unit or from the second transfer unit to the first transfer unit.

10 Claims, 5 Drawing Sheets

(56) References Cited

U.S. PATENT DOCUMENTS

| | | | | |
|---|---|---|---|---|
| 2001/0005665 | A1* | 6/2001 | Hempel | B24D 9/10<br>451/41 |
| 2006/0003671 | A1* | 1/2006 | Stumpf | B24B 37/345<br>451/41 |
| 2011/0104997 | A1* | 5/2011 | Jeong | H01L 21/67219<br>451/65 |
| 2021/0323118 | A1* | 10/2021 | Rangarajan | H01L 21/67219 |

* cited by examiner

SUBSTRATE TRANSFERRING SYSTEM

CROSS-REFERENCE TO RELATED APPLICATION

This application claims the benefit of Korean Patent Application No. 10-2021-0026383 filed on Feb. 26, 2021, in the Korean Intellectual Property Office, the entire disclosure of which is incorporated herein by reference for all purposes.

BACKGROUND

1. Field of the Invention

One or more example embodiments relate to a substrate transferring system.

2. Description of the Related Art

In the process of manufacturing a semiconductor device, a chemical mechanical polishing or planarization (CMP) process including polishing, buffing, and cleaning is required. The semiconductor device may be configured to have a multilayer structure wherein a transistor device with a diffusion region is provided at a substrate layer. In the substrate layer, a connecting metallic line may be patterned and electrically connected to the transistor device that constitutes a functional device. A patterned conductive layer may be insulated from other conductive layers by an insulator such as silicon dioxide. As more metal layers and corresponding insulating layers are formed, a need to flatten insulators may increase. Without flattening, manufacturing an additional metal layer may be more difficult due to numerous irregularities in a surface. In addition, the metallic line pattern may be formed of an insulator and a metal CMP process may be performed to remove excess metal.

To increase the production efficiency of the CMP process, reducing a waiting time between processes or transfers and performing the processes or transfers in parallel are required. For example, a production efficiency of the CMP process may be improved by reducing a substrate transfer path and simultaneously performing transferring and polishing on a plurality of substrates.

The above description is information the inventor(s) acquired during the course of conceiving the present disclosure, or already possessed at the time, and is not necessarily art publicly known before the present application was filed.

SUMMARY

Example embodiments provide a substrate transferring system to perform transferring and polishing on a plurality of substrates simultaneously.

Example embodiments provide a substrate transferring system to reduce a substrate transferring path and enhance a transferring efficiency.

According to an aspect, there is provided a substrate transferring system including a first transfer unit to transfer a substrate along a circular first orbit while rotating on a first axis perpendicular to a ground, and a second transfer unit to transfer a substrate along a circular second orbit while rotating on a second axis perpendicular to the ground, wherein the first orbit and the second orbit may overlap with each other at a first point, and at the first point, a substrate may be transferred from the first transfer unit to the second transfer unit or from the second transfer unit to the first transfer unit.

The first transfer unit may receive a substrate from a return unit or transfer a substrate to the return unit at a second point on the first orbit.

The return unit may transfer an unpolished substrate from a cassette to the first transfer unit at the second point or transfer a polished substrate to a cleaning chamber at the second point.

The first transfer unit may transfer a substrate from the first point to the second point while simultaneously transferring another substrate from the second point to the first point.

The second orbit may overlap with a first platen on which a polishing pad is seated at a third point, and at the third point, polishing may be performed on the substrate.

While the substrate is polished at the third point, at the first point, another substrate may be transferred from the first transfer unit to the second transfer unit or from the second transfer unit to the first transfer unit.

The second transfer unit may transfer a substrate from the third point to the first point while simultaneously transferring another substrate from the first point to the third point.

The substrate transferring system may further include a third transfer unit to transfer a substrate along a circular third orbit while rotating on a third axis perpendicular to the ground, wherein the first orbit and the third orbit may overlap with each other at a fourth point, and at the fourth point, a substrate may be transferred from the first transfer unit to the third transfer unit or from the third transfer unit to the first transfer unit.

The third orbit may overlap with a second platen on which a polishing pad is seated at a fifth point, and at the fifth point, polishing may be performed on a substrate at the fifth point.

While the substrate is polished at the fifth point, at the fourth point, another substrate may be transferred from the first transfer unit to the third transfer unit or from the third transfer unit to the first transfer unit.

The third transfer unit may transfer a substrate from the fifth point to the fourth point while simultaneously transferring another substrate from the fourth point to the fifth point.

The first transfer unit may transfer a first substrate from the second point to the first point while simultaneously transferring a second substrate from the first point to the fourth point and simultaneously transferring a third substrate from the fourth point to the second point.

Additional aspects of example embodiments will be set forth in part in the description which follows and, in part, will be apparent from the description, or may be learned by practice of the disclosure.

According to example embodiments, a substrate transferring system may improve a production efficiency by transferring a plurality of substrates such that the plurality of substrates may be continuously polished in parallel.

According to example embodiments, a substrate transferring system may be configured to perform loading or unloading a second substrate while performing polishing on a first substrate, and thus, may improve a production efficiency.

According to example embodiments, a substrate transferring system may reduce a transferring path and improve a transferring efficiency by transferring a substrate along a circular orbit.

The effects of the substrate transferring system are not limited to the above-mentioned effects, and other unmentioned effects can be clearly understood from the above description by those having ordinary skill in the technical field to which the present disclosure pertains.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
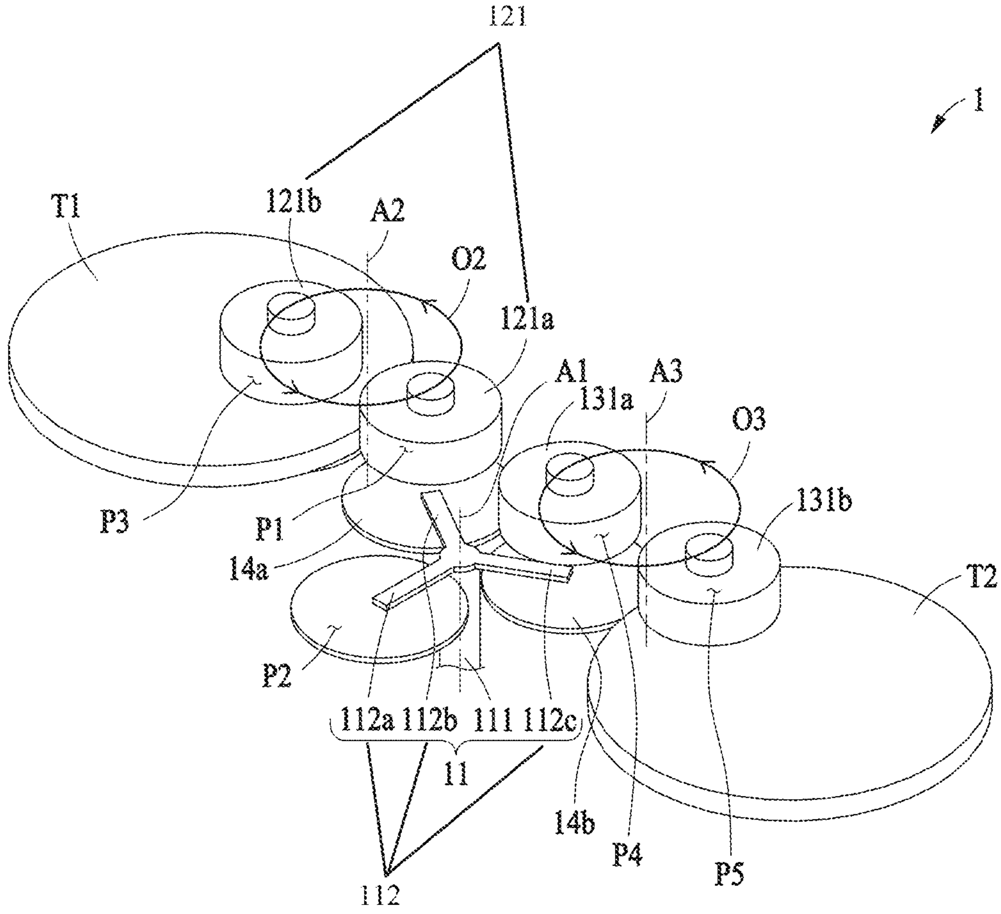
FIG. 1 is a schematic perspective view of a substrate transferring system according to an example embodiment.

Hereinafter, example embodiments will be described in detail with reference to the accompanying drawings. However, various alterations and modifications may be made to the example embodiments. Here, the example embodiments are not construed as limited to the disclosure. Here, the example embodiments are not construed as limited to the disclosure and should be understood to include all changes, equivalents, and replacements within the idea and the technical scope of the disclosure.

The terminology used herein is for the purpose of describing particular example embodiments only and is not to be limiting of the example embodiments. The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the example embodiments with reference to the accompanying drawings, like reference numerals refer to like constituent elements and a repeated description related thereto will be omitted. In the description of example embodiments, detailed description of well-known related structures or functions will be omitted when it is deemed that such description will cause ambiguous interpretation of the present disclosure.

Also, in the description of the components, terms such as first, second, A, B, (a), (b) or the like may be used herein when describing components of the present disclosure. These terms are used only for the purpose of discriminating one constituent element from another constituent element, and the nature, the sequences, or the orders of the constituent elements are not limited by the terms. When one constituent element is described as being "connected", "coupled", or "attached" to another constituent element, it should be understood that one constituent element can be connected or attached directly to another constituent element, and an intervening constituent element can also be "connected", "coupled", or "attached" to the constituent elements.

The same name may be used to describe an element included in the example embodiments described above and an element having a common function. Unless otherwise mentioned, the descriptions on the example embodiments may be applicable to the following example embodiments and thus, duplicated descriptions will be omitted for conciseness.

Figure 2:
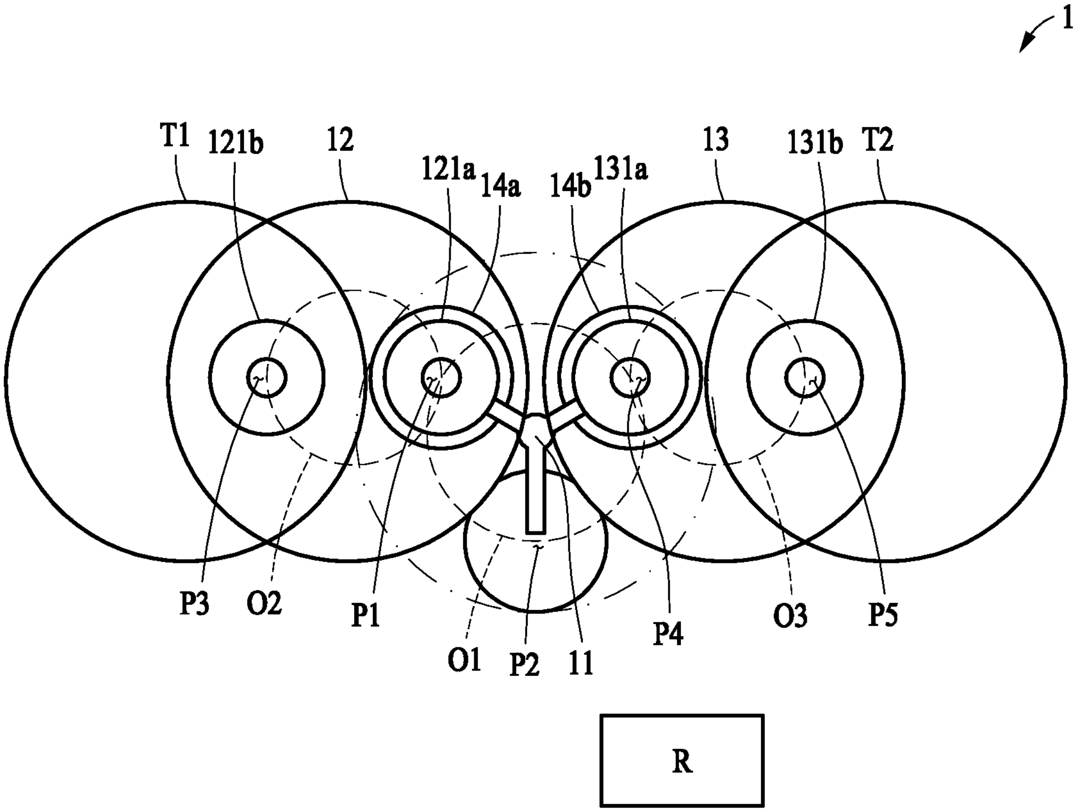
FIG. 2 is a schematic plan view of a substrate transferring system according to an example embodiment.
Figure 3:
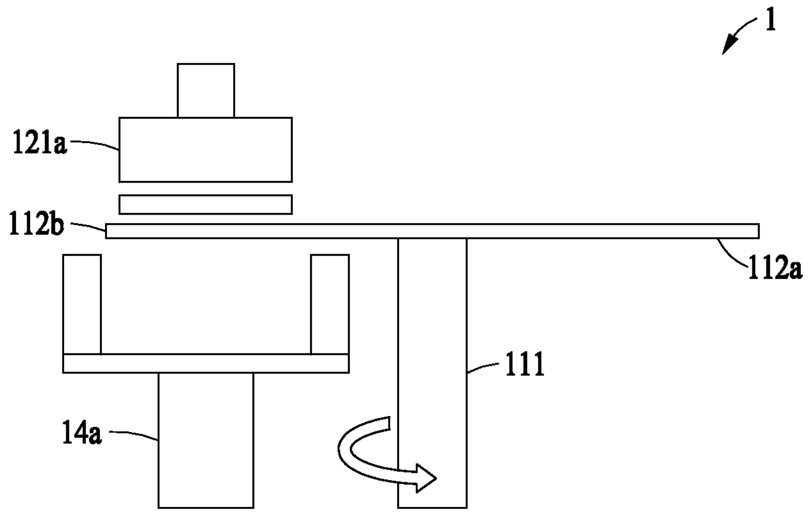
FIG. 3 is a schematic side view of a substrate transferring system according to an example embodiment.

FIG. 1 is a schematic perspective view of a substrate transferring system according to an example embodiment. FIG. 2 is a schematic plan view of a substrate transferring system according to an example embodiment. FIG. 3 is a schematic side view of a substrate transferring system according to an example embodiment.

Referring to FIGS. 1 to 3, a substrate transferring system 1 may be used in a chemical mechanical polishing or planarization (CMP) process to polish a surface of a substrate. A substrate transferred and/or polished by the substrate transferring system 1 may be a silicon wafer for manufacturing a semiconductor device. However, the type of the substrate is not limited to the foregoing example. For example, the substrate may include glass for a liquid crystal display (LCD) or a plasma display device (FPD). Although the drawings illustrate a substrate in a circular form, the example is only for ease of description and the form of the substrate is not limited to those illustrated in the drawings.

The substrate transferring system 1 may include a first transfer unit 11, a second transfer unit 12, a third transfer unit 13, and a loader 14.

The first transfer unit 11 may transfer a substrate along a circular first orbit O1 while rotating on a first axis A1 perpendicular to a ground. The first transfer unit 11 may receive an unpolished substrate from a cassette (or, a process prior to polishing) through a return unit R. The first transfer unit 11 may transfer the received substrate to the second transfer unit 12. In addition, the first transfer unit 11 may receive a polished substrate from the second transfer unit 12 and may transfer the polished substrate for a process after polishing (for example, a cleaning chamber) through the return unit R. The first transfer unit 11 may transfer a substrate along a circular orbit. The first transfer unit 11 may simultaneously transfer a plurality of substrates. For example, transfer of an unpolished substrate and transfer of a polished substrate may be performed simultaneously.

The first transfer unit 11 may include a shaft 111 and a transfer arm 112.

The shaft may rotate on a first axis A1 perpendicular to the ground. The shaft 111 may rotate in one direction or in two directions. The transfer arm 112 may be connected to the shaft 111 and may integrally rotate with the shaft 111. The transfer arm 112 may support a bottom surface of a substrate. For example, one end of the transfer arm 112 may be connected to the shaft 111, and another end may support a bottom surface of a substrate. However, the transfer arm 112 of FIG. 1 is schematically illustrated and a structure that may stably support a substrate may be provided at another end of the transfer arm 112.

The transfer arm 112 may form the first orbit O1 based on rotation of the shaft 111 and may rotate on the shaft 111. The first orbit O1 may be circular. The transfer arm 112 may transfer a substrate to one point on the first orbit O1 by rotating on the shaft 111 while the substrate is placed on an end portion.

At least one transfer arm 112 may be provided. For example, a plurality of transfer arms 112 may be provided. For example, the transfer arms 112 may include a first transfer arm 112*a*, a second transfer arm 112*b*, and a third transfer arm 112*c*. The plurality of transfer arms 112 may each be disposed at a predetermined interval with the shaft 111 as a center. For example, the plurality of transfer arms 112 may each be disposed at an equiangular interval with the shaft 111 as a center. However, the number of transfer arms 112 illustrated in FIGS. 1 and 2 is just an example, and one, two, three, four, or more transfer arms 112 may be provided. A more detailed description on a transfer of a substrate by the transfer arms 112 is described below.

The second transfer unit 12 may transfer a substrate along a circular second orbit O2 while rotating on a second axis A2 perpendicular to the ground. For example, the second transfer unit 12 may support a carrier head 121 from an upper side and may transfer the carrier head 121 along the second orbit O2 with the second axis A2 as a center. A substrate may be transferred by the second transfer unit 12 while being gripped by the carrier head 121. The carrier head may grip a substrate by adsorption through a membrane (not shown). The loader 14, which will be described below, may transfer a substrate between the transfer arm 112 and the carrier head 121. The carrier head 121 may perform polishing by frictionally contacting a polishing pad placed on a first platen T1 and a polishing surface of the substrate. The carrier head 121 and the first platen T1 may polish the substrate by the polishing pad through at least a relative rotational motion. For example, the carrier head 121 may rotate and/or translate (oscillate) to polish a substrate. Meanwhile, the carrier head 121 may move in a vertical direction for loading/unloading a substrate or polishing the substrate. The second transfer unit 12 may include at least one carrier head 121. For example, the second transfer unit 12 may include a plurality of carrier heads 121. For example, the second transfer unit 12 may include a first carrier head 121*a* and a second carrier head 121*b*. However, the number of carrier heads 121 connected to the second transfer unit 12 is not limited by the foregoing examples. When the plurality of carrier heads 121 is connected to the second transfer unit 12, each of the plurality of carrier heads 121 may be disposed at a predetermined interval with the second axis A2 as a center. For example, each of the plurality of carrier heads 121 may be disposed at an equiangular interval with the second axis A2 as a center.

The third transfer unit 13 may transfer a substrate along a circular third orbit O3 while rotating on a third axis A3 perpendicular to the ground. For example, the third transfer unit 13 may support a carrier head 131 from an upper side and may transfer the carrier head 131 along the third orbit O3 with the third axis A3 as a center. A description of the third transfer unit 13, the carrier head 131, and a second platen T2 may be substantially same as the description of the second transfer unit 12, the carrier head 121, and the first platen T1, and thus, only the following description is provided to avoid excessive repetition.

The loader 14 may load an unpolished substrate from the transfer arm 112 to the carrier heads 121 and 131. The loader 14 may unload a polished substrate from the carrier heads 121 and 131 to the transfer arm 112. The loader 14 may load or unload a substrate through moving vertically. In a process of loading or unloading a substrate by the loader 14, the first transfer unit 11 (for example, the transfer arm 112) may move in a vertical direction. A plurality of loaders 14 may be provided. For example, a number of loaders 14 may correspond to a number of platens T. For example, as shown in FIGS. 1 and 2, when a platen T includes the first platen T1 and the second platen T2, the loader 14 may include a first loader 14*a* and a second loader 14*b*. Meanwhile, the loader 14 may be integrally formed with the first transfer unit 11. That is, the first transfer unit 11 (for example, the transfer arm 112) may load or unload a substrate to the carrier head 121 by itself through moving vertically without a loader.

Hereinafter, the first orbit O1 of the first transfer unit 11 is described with reference to FIGS. 1 and 2.

The first transfer unit 11 may receive a substrate from the return unit R at the second point P2 on the first orbit O1. For example, the first transfer unit 11 may receive an unpolished substrate from a cassette (or for a process prior to polishing) through the return unit R at the second point P2. The received substrate may be seated on the transfer arm 112 placed on the second point P2. In addition, the first transfer unit 11 may transfer a substrate to the return unit R at the second point P2. For example, the first transfer unit 11 may transfer a polished substrate for a next process (for example, a cleaning process) through the return unit R at the second point P2. That is, the second point P2 may function as a stage on which a substrate in waiting for transfer is seated. The return unit R may be a return robot configured to transfer an unpolished substrate from the cassette to the first transfer unit 11 at the second point P2, or to transfer a polished substrate to the cleaning chamber at the second point P2.

The first orbit O1 and the second orbit O2 may overlap at the first point P1. At the first point P1, a substrate may be transferred from the first transfer unit 11 to the second transfer unit 12. For example, at the first point P1, the first transfer unit 11 may transfer (load) an unpolished substrate to the second transfer unit 12. At the first point P1, the substrate may be transferred from the second transfer unit 12 to the first transfer unit 11. For example, at the first point P1, the second transfer unit 12 may transfer (unload) a polished substrate to the first transfer unit 11. The first loader 14*a* may transfer a substrate between the first transfer unit 11 and the second transfer unit 12 at the first point P1. For this transfer, the first loader 14*a* may be placed on the first point P1. The first loader 14*a* may load an unpolished substrate from the transfer arm 112 placed on the first point P1 to the carrier head 121 placed on the first point P1. The first loader 14*a* may unload a polished substrate from the carrier head 121 placed on the first point P1 to the transfer arm 112 placed on the first point P1.

Similarly, the first orbit O1 and the third orbit O3 may overlap at a fourth point P4. At the fourth point P4, the substrate may be transferred from the first transfer unit 11 to the third transfer unit 13. For example, at the fourth point P4, the first transfer unit 11 may transfer (load) an unpolished substrate to the third transfer unit 13. At the fourth point P4, the substrate may be transferred from the third transfer unit 13 to the first transfer unit 11. For example, at the fourth point P4, the third transfer unit 13 may transfer (unload) a polished substrate to the first transfer unit 11. At the fourth point P4, the second loader 14*b* may transfer a substrate between the first transfer unit 11 and the third transfer unit 13. For this transfer, the second loader 14*b* may be placed on the fourth point P4. The second loader 14*b* may load an unpolished substrate from the transfer arm 112 placed on the fourth point P4 to the carrier head 131 placed on the fourth point P4. The second loader 14*b* may unload a polished substrate from the carrier head 131 placed on the fourth point P4 to the transfer arm 112 placed on the fourth point P4.

The transfer arm 112 of the first transfer unit 11 may be sequentially placed on the second point P2, the first point P1 and the fourth P4 while rotating along the first orbit O1. For example, when a first transfer arm 112*a* is placed on the second point P2, a second transfer arm 112*b* may be placed on the first point P1 and a third transfer arm 112*c* may be placed on the fourth point P4. By rotation of the shaft 111, when the first transfer arm 112*a* is moved from the second point P2 to the first point P1, the second transfer arm 112*b* may be moved from the first point P1 to the fourth point P4 and the third transfer arm 112*c* may be moved from the fourth point P4 to the second point P2. That is, the first transfer unit 11 may transfer a first substrate from the second point P2 to the first point P1 while simultaneously transferring a second substrate from the first point P1 to the fourth point P4 and a third substrate from the fourth point P4 to the second point P2. The example is not limited thereto. The first transfer unit 11 may rotate in a direction opposite to the one described above and the transfer arm 112 may be directly transferred from the second point P2 to the fourth point P4 passing by the first point P1.

Hereinafter, the second orbit O2 of the second transfer unit 12 is described with reference to FIGS. 1 and 2.

The carrier head 121 of the second transfer unit 12 may receive (load) an unpolished substrate from the first transfer unit 11 at the first point P1. When loading of a substrate is completed, the carrier head 121 may be moved to the third point P3 by rotation of the second transfer unit 12. The third point may be a point where the second orbit O2 overlaps with the first platen T1 on which a polishing pad is seated. At the third point P3, polishing on the substrate may be performed. That is, the carrier head 121 may perform polishing on the unpolished substrate at the third point P3. When polishing of the substrate is completed, the carrier head 121 may move back to the first point P1 by rotation of the second transfer unit 12. At the first point P1, the carrier head 121 may transfer (unload) the unpolished substrate to the first transfer unit 11.

While a substrate is polished at the third point P3, another substrate may be transferred (loaded) from the first transfer unit 11 to the second transfer unit 12, or may be transferred (unloaded) from the second transfer unit 12 to the first transfer unit 11 at the first point P1. That is, while polishing is performed on the substrate at a second carrier head 121*b*, another substrate may be loaded or unloaded at the first carrier head 121*a*.

The carrier head 121 of the second transfer unit 12 may be sequentially placed on the first point P1 and the third point P3 while the carrier head 121 is rotating along the second orbit O2. For example, when the first carrier head 121*a* is placed on the first point P1, the second carrier head 121*b* may be placed on the third point P3. By rotation of the second transfer unit 12, when the first carrier head 121*a* is moved from the first point P1 to the third point P3, the second carrier head 121*b* may be moved from the third point P3 to the first point P1. That is, the second transfer unit 12 may transfer the substrate from the third point P3 to the first point P1 while simultaneously transferring another substrate from the first point P1 to the third point P3.

Hereinafter, the third orbit O3 of the third transfer unit 13 is described with reference to FIGS. 1 and 2.

The carrier head 131 of the third transfer unit 13 may receive (load) an unpolished substrate from the first transfer unit 11 at the fourth point P4. When the substrate is loaded, the carrier head 131 of the third transfer unit 13 may move to a fifth point P5 by rotation of the third transfer unit 13. The fifth point P5 may be a point where the second orbit O2 overlaps with the second platen T2 on which a polishing pad is seated. At the fifth point P5, polishing of a substrate may be performed. That is, the carrier head 131 may perform polishing on an unpolished substrate at the fifth point P5. When the substrate is polished, the carrier head 131 may move back to the fourth point P4 by rotation of the third transfer unit 13. At the fourth point P4, the carrier head 131 may transfer (unload) a polished substrate to the first transfer unit 11.

While a substrate is polished at the fifth point P5, at the fourth point P4, another substrate may be transferred (loaded) from the first transfer unit 11 to the third transfer unit 13 or may be transferred (unloaded) from the third transfer unit 13 to the first transfer unit 11. That is, while polishing is performed on the substrate at the second carrier head 131*b*, another substrate may be loaded or unloaded at the first carrier head 131*a*.

The carrier head 131 of the third transfer unit 13 may be sequentially placed on the fourth point P4 and the fifth point P5 while rotating along the third orbit O3. For example, when the first carrier head 131*a* is placed on the fourth point P4, the second carrier head 131*b* may be placed on the fifth point P5. By rotation of the third transfer unit 13, when the first carrier head 131*a* is moved from the fourth point P4 to the fifth point P5, the second carrier head 131*b* may be moved from the fifth point P5 to the fourth point P4. That is, the third transfer unit 13 may transfer a substrate from the fourth point P4 to the fifth point P5 while simultaneously transferring another substrate from the fifth point P5 to the fourth point P4.

For example, primary polishing may be performed at the first platen T1 and secondary polishing may be performed at the second platen T2. In this case, when a substrate on which the primary polishing is performed at the first platen T1 is unloaded from the second transfer unit 12 to the first transfer unit 11 at the first point P1, the first transfer unit 11 may transfer the substrate to the fourth point P4 by rotation. The substrate on which the primary polishing is performed may be loaded to the third transfer unit 13 at the fourth point P4, and the third transfer unit 13 may transfer the substrate to the fifth point P5 by rotation and secondary polishing may be performed on the substrate.

For example, a substrate transferred to the second point P2 may be gripped by the carrier head 121 placed on the first point P1 after being transferred to the first point P1, and may be polished by the first platen T1 at the third point P3. The substrate polished at the first the first platen T1 may return to the first point P1, may be seated on the transfer arm 112 placed on the first point P1, may move to the fourth point P4 and be gripped by the carrier head 131 placed on the fourth point P4, and may be polished by the second platen T2 at the fifth point P5. The substrate polished at the second platen T2 may return to the fourth point P4, may be seated on the transfer arm 112 placed on the fourth point P4, and may move to the second point P2 and may be transferred for a next process.

As described above, when the second transfer unit 12 transfers a carrier and/or a substrate by rotation, transferring (for example, loading/unloading) and polishing a plurality of substrates may be performed simultaneously. For example, while a first substrate is loaded to the first carrier head 121*a* at the first point P1, a second substrate may be gripped by the second carrier head 121*b* placed on the third point P3 and may be polished. In addition, when the second substrate is polished, the second substrate may be moved to the first point P1 and may be unloaded to the transfer arm 112 placed on the first point P1, conversely, the first substrate may be moved to the third point P3 and may be polished. Through the above-described configuration, while a substrate is being polished, simultaneously another substrate may be loaded (or unloaded). Thus, process time may be reduced and productivity may be enhanced.

In addition, as described above, when the first transfer unit 11 transfers a substrate in a rotary way, a transfer path and transfer time may be minimized. For example, when a first substrate which is unpolished is inserted to the second point P2 from the cassette, the first substrate may be transferred to the first point P1 and may be loaded for the primary polishing. Simultaneously, a second substrate on which the primary polishing is performed wherein the second substrate is seated on the first point P1, may be transferred to the fourth point P4 and may be loaded for the secondary polishing. In addition, simultaneously, a third substrate on which the secondary polishing is performed wherein the third substrate is seated on the fourth point P4, may be transferred to the second point P2 and may be transferred for a next process. The above-mentioned process may be simultaneously, sequentially, and continuously performed on a plurality of substrates. Thus, a production efficiency may be enhanced since a plurality of substrates may be simultaneously and continuously transferred and polished.

Figure 4:
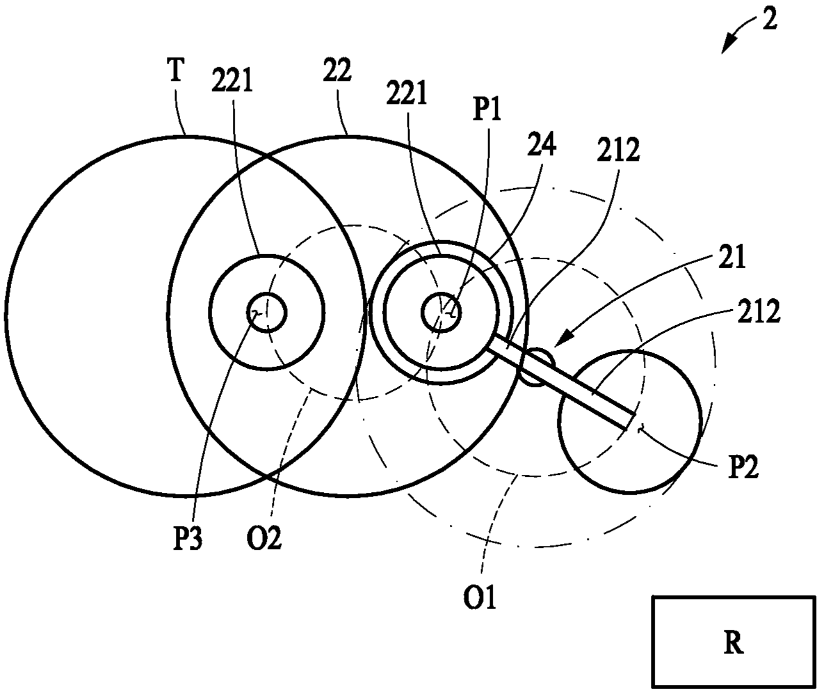
FIG. 4 is a schematic plan view of a substrate transferring system according to an example embodiment.

FIG. 4 is a schematic plan view of a substrate transferring system according to an example embodiment.

Referring to FIG. 4, a substrate transferring system 2 may include a first transfer unit 21, a second transfer unit 22, and a loader 24.

FIG. 4 illustrates a structure including two transfer arms 212, the second transfer unit 22 provided with two carrier heads 221, and one loader 24 and one platen T. Referring to the structure of FIG. 4, a description of a second point P2, a first point P1, and a third point P3 has been omitted because it is substantially same as the above-mentioned description.

Even in the structure of FIG. 4, while a first substrate is polished at the third point P3, a second substrate may be loaded or unloaded at the first point P1. In addition, by rotation of the first transfer unit 21, an unpolished substrate placed on the second point P2 may be transferred to the first point P1, while a polished substrate placed on the first point P1 may be transferred to the second point P2 simultaneously. That is, the first transfer unit 21 may transfer a substrate from the first point P1 to the second point P2 while simultaneously transferring another substrate from the second point P2 to the first point P1.

Figure 5:
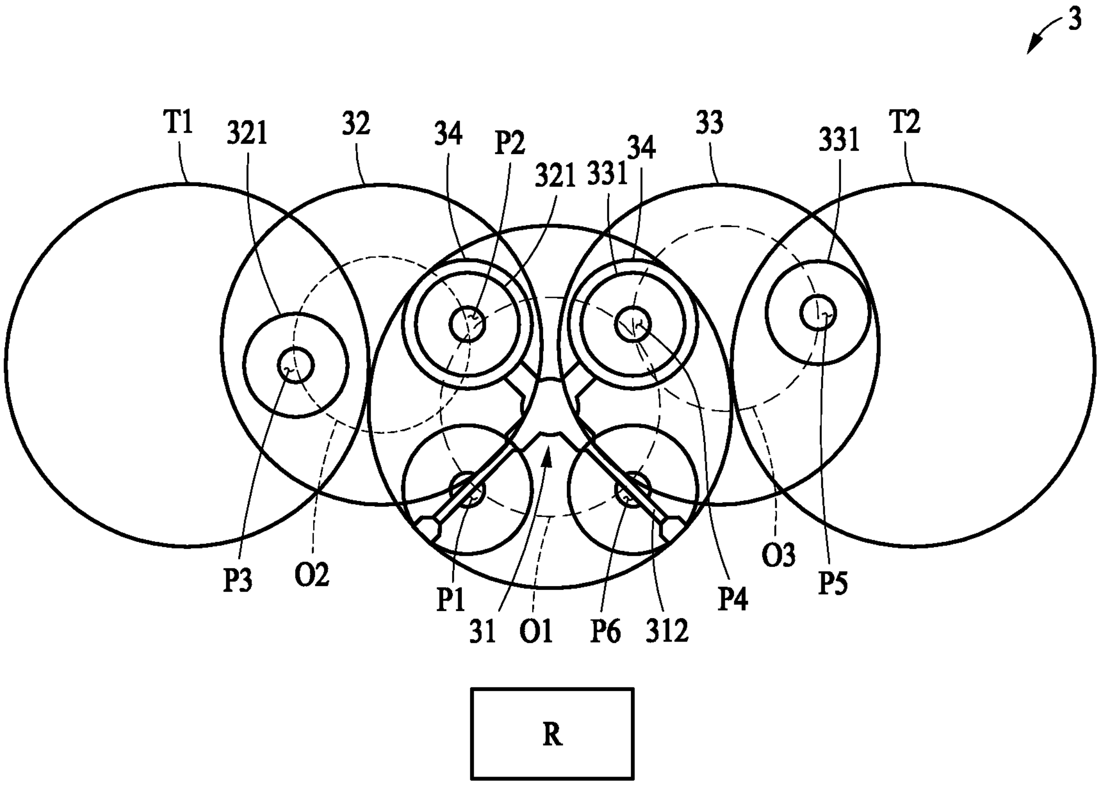
FIG. 5 is a schematic plan view of a substrate transferring system according to an example embodiment.

FIG. 5 is a schematic plan view of a substrate transferring system according to an example embodiment.

Referring to FIG. 5, a substrate transferring system 3 may include a first transfer unit 31, a second transfer unit 32, a third transfer unit 33, and a loader 34.

FIG. 5 illustrates a structure including the first transfer unit 31 including four transfer arms 312, the second transfer unit 32 provided with two carrier heads 321, the third transferring unit 33 provided with two carrier heads 331, and two loaders 34 and two platens T. In the structure of FIG. 5, the four transfer arms 312 may be placed on a second point P2, a first point P1, a fourth point P4 and a sixth point P6 respectively. The sixth point P6 may be a point where an unpolished substrate is received from a return unit R or a polished substrate is transferred to the return unit R.

Even in the structure of FIG. 5, while a first substrate is polished at a third point P3 (or a fifth point P5), a second substrate may be loaded or unloaded at the first point P1 (or the fourth point P4). In addition, a substrate may be sequentially transferred by rotation of the first transfer unit 31. For example, an unpolished substrate placed on the second point P2 may be transferred to the first point P1 or the fourth point P4. Simultaneously, a polished substrate placed on the first point P1 or the fourth point P4 may be transferred to the sixth point P6.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. For example, suitable results may be achieved if the described techniques are performed in a different order and/or if components in a described system, architecture, device, or circuit are combined in a different manner and/or replaced or supplemented by other components or their equivalents.

Accordingly, other implementations are within the scope of the following claims.

What is claimed is:

1. A substrate transferring system comprising:

a first transfer unit to transfer a substrate along a circular first orbit while rotating on a first axis perpendicular to a ground, the first transfer unit comprising a plurality of spaced arms extending from the first axis;

a second transfer unit to transfer a substrate along a circular second orbit while rotating on a second axis perpendicular to the ground;

a third transfer unit to transfer a substrate along a circular third orbit while rotating on a third axis perpendicular to the ground, and wherein the first axis is offset from a line defined between the second axis and the third axis, wherein the first orbit and the second orbit overlap with each other at a first point, and at the first point, a substrate is transferred from the first transfer unit to the second transfer unit or from the second transfer unit to the first transfer unit, wherein the second axis is outside the circular first orbit during the transfer, wherein the substrate transferring system further comprises a loader to transfer the substrate at the first point between a first arm of the plurality of arms of the first transfer unit and the second transfer unit;

wherein the first transfer unit is configured to receive a substrate from a return unit or transfer a substrate to the return unit at a second point on the first orbit, and to transfer the substrate from the first point to the second point while simultaneously transferring another substrate from the second point to the first point.

2. The substrate transferring system of claim 1, wherein, the return unit transfers an unpolished substrate from a cassette to the first transfer unit at the second point or transfers a polished substrate to a cleaning chamber at the second point.

3. The substrate transferring system of claim 1, wherein the second orbit overlaps with a first platen on which a polishing pad is seated at a third point, and at the third point, polishing is performed on the substrate.

4. The substrate transferring system of claim 3, wherein while the substrate is polished at the third point, at the first point, another substrate is transferred from the first transfer unit to the second transfer unit or from the second transfer unit to the first transfer unit.

5. The substrate transferring system of claim 4, wherein the second transfer unit transfers a substrate from the third point to the first point while simultaneously transferring another substrate from the first point to the third point.

6. The substrate transferring system of claim 1, wherein the first orbit and the third orbit overlap with each other at a fourth point, and at the fourth point, a substrate is transferred from the first transfer unit to the third transfer unit or from the third transfer unit to the first transfer unit.

7. The substrate transferring system of claim 6, wherein the third orbit overlaps with a second platen on which a polishing pad is seated at a fifth point, and at the fifth point, polishing is performed on a substrate at the fifth point.

8. The substrate transferring system of claim 7, wherein while the substrate is polished at the fifth point, at the fourth point, another substrate is transferred from the first transfer unit to the third transfer unit or from the third transfer unit to the first transfer unit.

9. The substrate transferring system of claim 8, wherein the third transfer unit transfers a substrate from the fifth point to the fourth point while simultaneously transferring another substrate from the fourth point to the fifth point.

10. The substrate transferring system of claim 6, wherein the first transfer unit transfers a first substrate from the second point to the first point while simultaneously transferring a second substrate from the first point to the fourth point and simultaneously transferring a third substrate from the fourth point to the second point.

* * * * *